United States Patent [19]
Yamashita et al.

[11] Patent Number: 5,465,066
[45] Date of Patent: Nov. 7, 1995

[54] WAVEFORM FORMATTER

[75] Inventors: Kazuhiro Yamashita, Kazo; Toshiyuki Negishi, Ouura; Masatoshi Sato; Hiroshi Tsukahara, both of Gyoda, all of Japan

[73] Assignee: Advantest Corporation, Tokyo, Japan

[21] Appl. No.: 310,162

[22] Filed: Sep. 21, 1994

[30] Foreign Application Priority Data

Sep. 21, 1993 [JP] Japan .................. 5-055709 U

[51] Int. Cl.$^6$ .............................. H03K 1/04; H03K 11/00
[52] U.S. Cl. .................. 327/294; 327/241; 327/270; 327/273; 327/407; 371/2.1; 371/24; 395/183.01
[58] Field of Search ..................... 327/294, 407, 327/241, 270, 273; 371/2.1, 15.1, 24

[56] References Cited

U.S. PATENT DOCUMENTS 5,406,132   4/1995   Housako .................. 327/294

*Primary Examiner*—Margaret Rose Wambach
*Attorney, Agent, or Firm*—Knobbe, Martens, Olson & Bear

[57] ABSTRACT

A waveform formatter for use in testing a semiconductor device is capable of reducing a total size of circuit configuration. The waveform formatter includes a plurality of clock generators in which at low-speed operation, clocks are used to generate waveforms and control signals of drivers, while at high-speed operation, all clocks are used to generate waveforms for drivers. The waveform formatter further includes a parallel-serial converter for converting parallel signals to a serial signal, a data selector for selecting the parallel signals or the serial signal, and a waveform combining circuit for accepting output signals of the clock generators through a format control unit and for generating waveforms and control signals for the drivers using the clocks from the clock generators.

5 Claims, 6 Drawing Sheets

WAVEFORM FORMATTER

FIELD OF THE INVENTION

This invention relates to a waveform formatter for a semiconductor tester, and more particularly, to a multi-clock waveform formatter for generating waveforms of test drivers by using multiple clocks.

BACKGROUND OF THE INVENTION

In a semiconductor device tester, an interleaving method is adopted to realize a high-speed clock generator. In a typical interleave method, a plurality of clock signals, for example, n clock signals, are multiplied to generate a combined clock signal which is n times faster than each clock signal. The high-speed clock generator is usually used as a waveform formatter circuit in a driver and a comparator in a semiconductor tester. The driver supplies a test signal to a device under tested and has a waveform formatter unit therein. The comparator compares the resultant signal from the device under test with an expected signal.

The use of the waveform formatter circuit incorporating a high-speed clock generator increases because of the increase in the number of pins of a device to be tested. For instance, hundreds of pins are used in a recent semiconductor device. The necessity of the interleaving method also increases because of the increase in operating speed of such a device under test (DUT). Therefore, the circuit scale of the high-speed clock generator tends to increase.

An example of circuit configuration of the conventional waveform formatter for a tester driver is shown in FIG. 2. First of all, a reference clock is generated by a test rate generator 1. By using the reference clock, a 2-way interleaving unit 2 generates timing data (a) for a odd cycle, a clock (b) for the odd cycle, timing data (c) for an even cycle, and a clock (d) for the even cycle.

Next, a clock signal CLOCK1 is generated in a clock generator 11 as follows: A timing data memory 111 sets the delay data to a counter type delay element 112. This counter type delay element 112 begins counting when the specified clock (b) is applied from the 2-way interleaving unit. The counter type delay element 112 generates a carry over when the count value reaches the set value. As a result, an AND gate 113 opens and the reference clock REF.CLK is output from the AND gate 113. A delay element 114 delays a signal passing therethrough for the amount of delay time smaller than one signal period of the reference clock. The output of the delay element 114 is applied to an input terminal of an OR gate 119.

A timing data memory 115 sets the delay data to a counter type delay element 116. This counter type delay element 116 begins counting when the specific clock (d) is applied from the 2-way interleaving unit. The counter type delay element 116 generates a carry over when the count value reaches the set value. As a result, an AND gate 117 opens and the reference clock REF.CLK is output from the AND gate 117. Delay element 118 delays a signal passing therethrough for the amount of delay time smaller than one signal period of the reference clock). The output of the delay element 118 is applied to the other input terminal of the OR gate 119. Therefore, an odd cycle clock and an even cycle clock are ORed in the OR gate 119 which generates the combined clock signal CLOCK1.

Based on the same procedure as above, high-speed clocks CLOCK2, CLOCK3, and CLOCK4 are generated by clock generators 12, 13 and 14, respectively. Next, in a format control unit 3, these four clocks CLOCK1–CLOCK4 are used to format waveforms necessary for controlling the tester drivers. The output of the format control unit 3 is given to a RS flip-flop 4 and a RS flip-flop 5. In the RS flip-flop 4, the waveform of a driver 6 is generated with the set timing to a pin S and the reset timing to a pin R. In the RS flip-flop 5, the output control signal of the driver 6 is generated with the set timing to a pin S and reset timing to a pin R.

As mentioned above, using the 2-way interleaving method, the two clocks, the clocks (b) and (d) are interleaved together and generated as the high-speed clock CLOCK1. The high speed clocks CLOCK2–CLOCK4 are similarly generated by the clock generators. Thus, waveforms and control signals for the drivers are generated using these four clocks CLOCK1–CLOCK4.

FIG. 3 shows the timing chart of the clock generator of FIG. 2. The odd cycle clock (b) and the even cycle clock (d), and the odd cycle timing data (a) and the even cycle timing data (c) are provided as shown in FIGS. 3A–3D. The reference clock REF.CLK is shown in FIG. 3E. After the time TC1 from an edge of the odd cycle clock (b), the signal (FIG. 3F) from counter type delay element 112 opens the AND gate 113, and the reference clock REF.CLK is output (FIG. 3G). The reference clock REF.CLK is delayed by the time TD1 (FIG. 3H) in the delay element 114 and is applied to the OR gate 119. The total amount (TC1+TD1) of delay time in the output of the delay element 114 is a numerical value that corresponds to the odd cycle timing data (a).

After the time TC2 from an edge of the even cycle clock (d), the signal (FIG. 3I) from the counter type delay element 116 opens gate 117 so that the reference clock REF.CLK is output (FIG. 3J). The reference clock REF.CLK is delayed by the time TD2 (FIG. 3K) in the delay element 118 and is applied to the OR gate 119. The total amount (TC2+TD2) of delay time in the output of the delay element 118 is a numerical value that corresponds to the odd cycle timing data (c). The resulted odd cycle clock and the even cycle clock are ORed by the OR gate 119 to produce a combined clock signal which has a clock rate two times higher than the original clocks (FIG. 3L).

A prior art waveform formatter described above has the following problems.

In general, in a high speed semiconductor device, an I/O split scheme is used wherein each pin of the device separately contributes as an input pin or an output pin. In contrast, in a relatively lower speed semiconductor device, an I/O control scheme is used wherein a pin functions either as an input pin or an output pin under the control of the an I/O control signal. Therefore, for testing a low speed semiconductor device, a semiconductor device tester has to be provided with a driver control circuit. However, such a driver control circuit is useless in testing a high speed semiconductor device since the pin function is fixed.

SUMMARY OF THE INVENTION

It is therefore an object of the present invention to provide a waveform formatter wherein an overall scale of circuits is decreased. Such a compact waveform formatter can be realized by forming a clock generator which can change functions depending on the speed of the device to be tested. Namely, at a low speed operation, clocks are used to generate waveforms and control signals of tester drivers, while at a high speed operation, all clocks are used to generate waveforms of the drivers.

3

According to the present invention, the waveform formatter has a parallel-serial converter which receives parallel data and parallel clocks from an interleaving unit and converts the parallel data to serial data with the timing of the clocks, a data selector for selecting either the parallel clocks (prior to the parallel-serial conversion) or the serial clock (after the parallel-serial conversion). The waveform formatter also has a waveform combing circuit for accepting clocks from clock generators through a format control unit and for combining these clocks to generate waveforms and control signals for tester drivers.

Because of such an arrangement, redundant circuits in the conventional structure which operate always in parallel even for testing a high speed device can be obviated. In the case of the high speed testing, a plurality of clocks can be combined to generate control signals by the waveform combining circuit, which has the same effect as the interleaving method.

DESCRIPTION OF THE PREFERRED EMBODIMENTS

Figure 1:
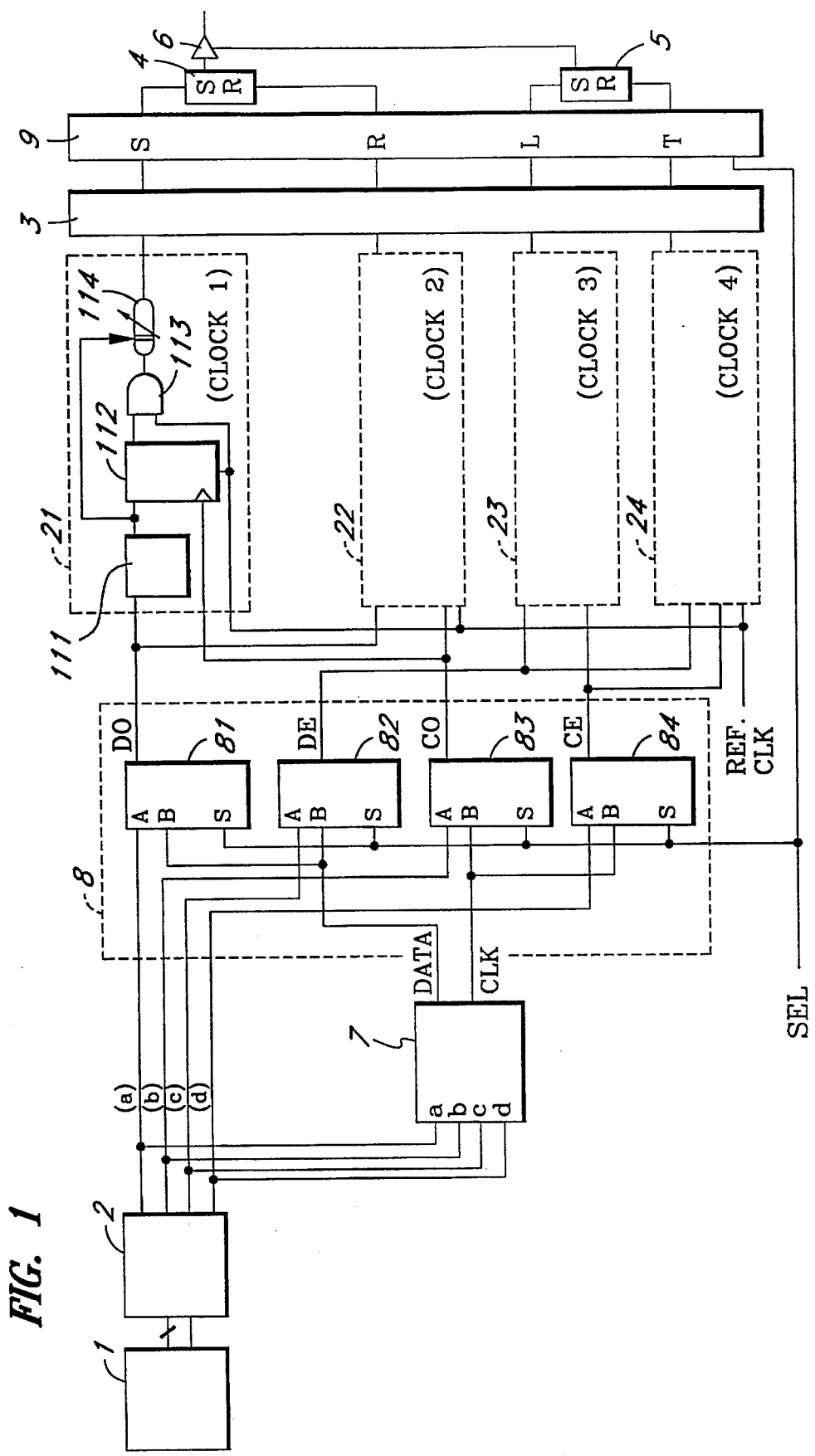
FIG. 1 is a block diagram illustrating an embodiment of the waveform formatter of the present invention.
Figure 2:
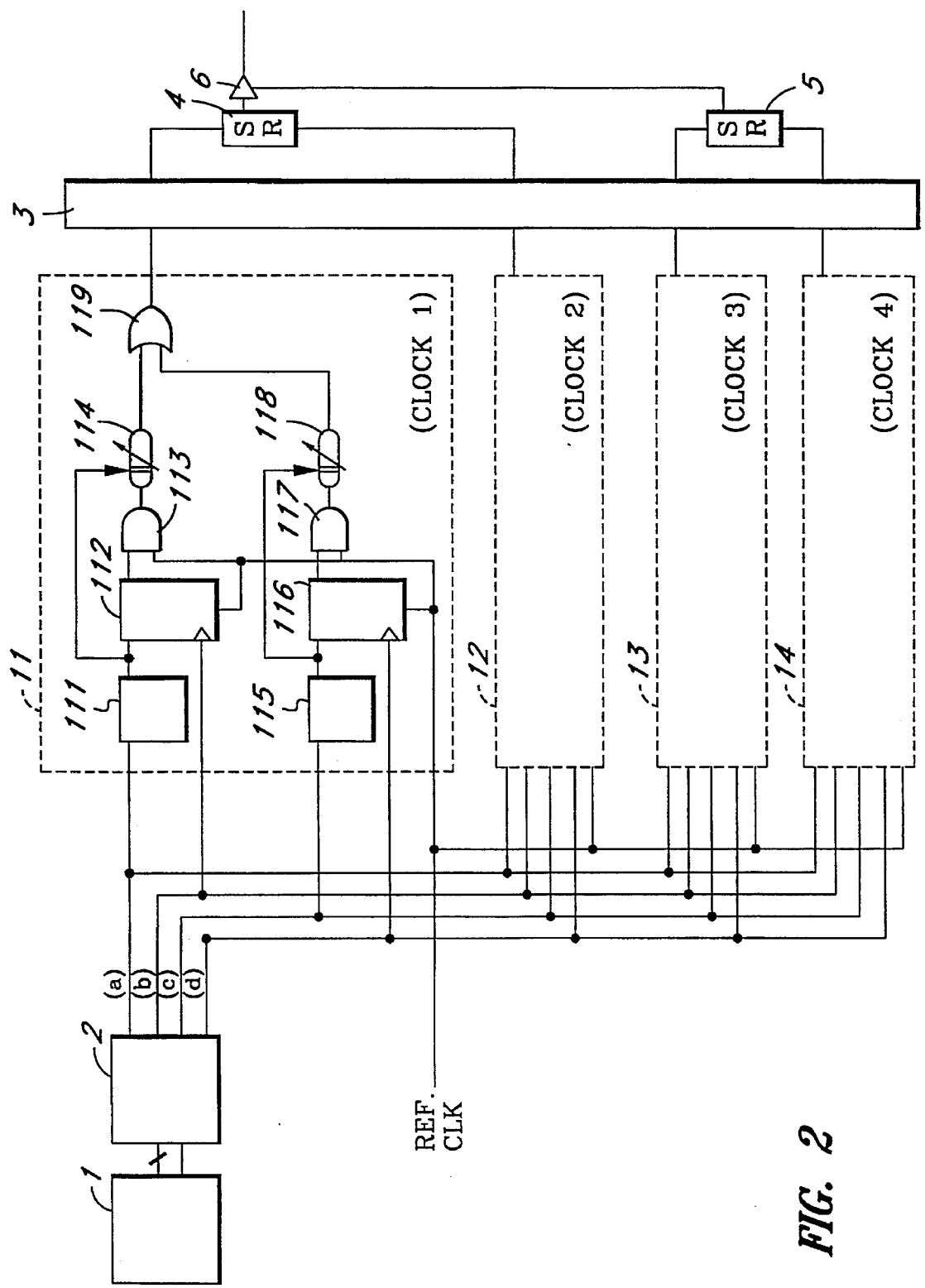
FIG. 2 is a block diagram showing a prior art waveform formatter.
Figure 3:
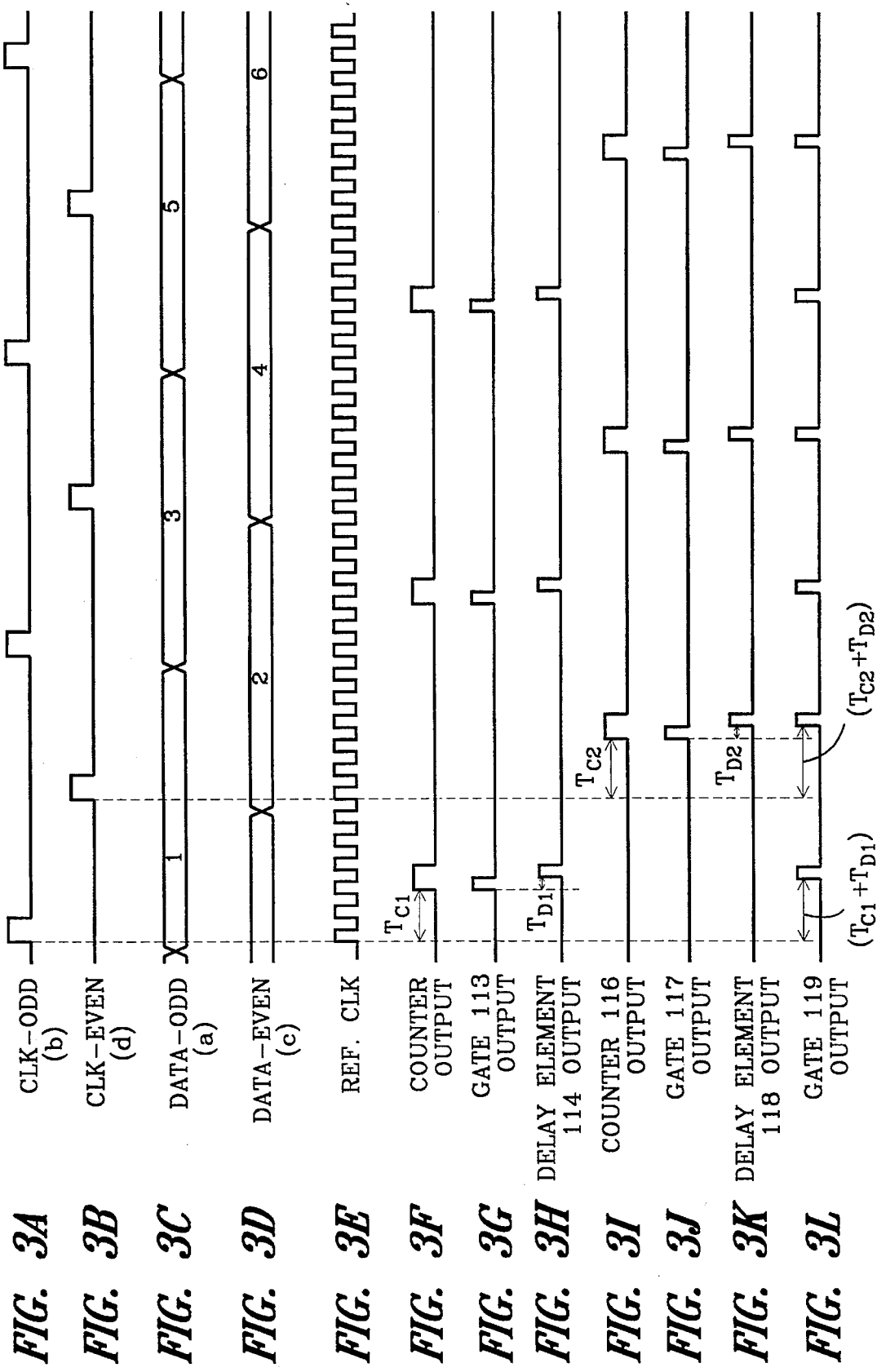
FIG. 3 is a timing chart explanatory of operation of the prior art waveform formatter of FIG. 2.

FIG. 1 illustrates in a block form an example of embodiments of the present invention, in which like parts corresponding to those in FIG. 2 are identified by the same reference numerals. In the arrangement of FIG. 1, a parallel-serial convertor 7, a data selector 8 and a waveform combining circuit 9 are additionally provided to the waveform formatter of FIG. 2. Further, clock generators 21–24 are provided which have a substantially simplified circuit structure compared with the conventional clock generators 1114 of FIG. 2.

Figure 4:
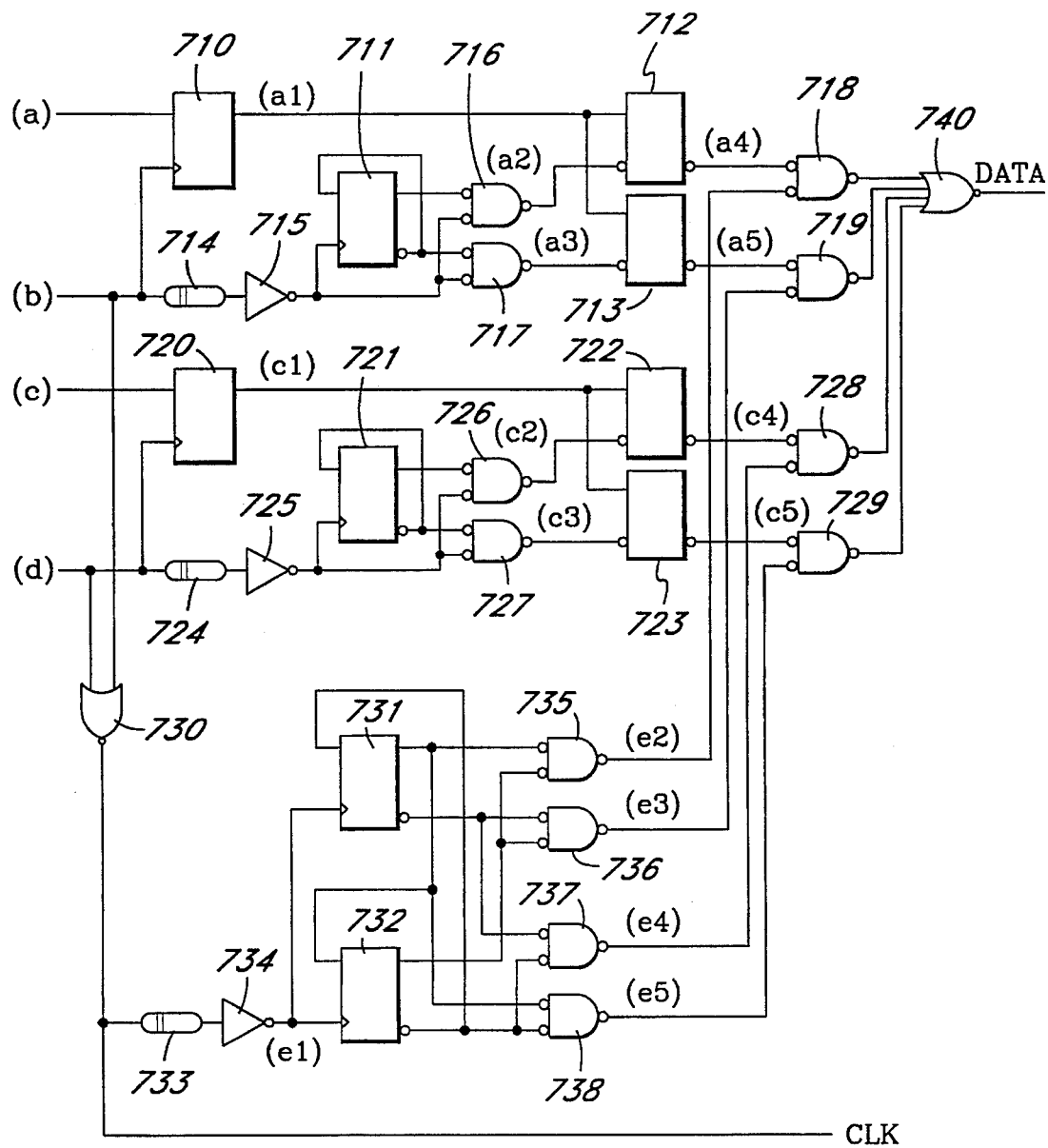
FIG. 4 is a block diagram of a parallel-serial convertor of the present invention.

The parallel-serial convertor 7 is connected at the output side of the 2-way interleaving unit 2. FIG. 4 shows an example of circuit structure of the parallel-serial convertor 7. The parallel-serial convertor 7 receives an odd cycle data stream (a) and an even cycle data stream (c), and arranges these two data and outputs a single data stream DATA at the output. For so doing, an odd cycle clock (b) and an even cycle clock (d) are used to determined the timing of the data streams. The odd cycle clock (b) and the even cycle clock (d) are combined by an OR gate 730 and a combined clock signal CLK is generated at an output terminal.

Figure 5:
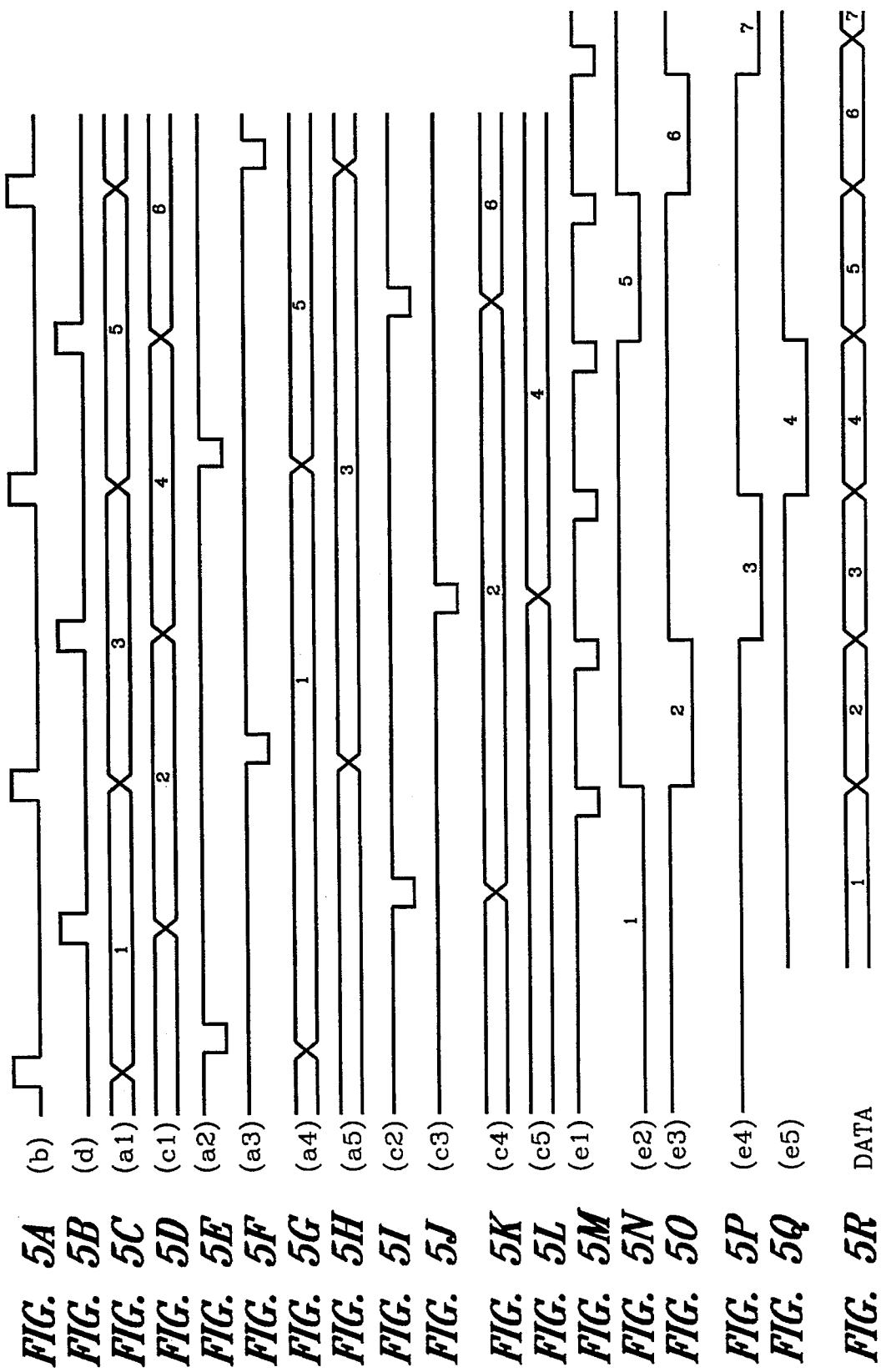
FIG. 5 is a timing chart explanatory of operation of the parallel-serial convertor of FIG. 4.

FIG. 5 shows a timing chart of the parallel-serial convertor 7 of FIG. 4. Data in two data streams a1 (first data, third data, and so on) and c1 (second data, fourth data and so on) are arranged alternatively and the DATA converted to the serial form is output. Namely, the DATA includes the first, second, third and fourth data in series with a clock rate of

4 two times faster than that of each of the original data a1 or c1.

With reference to FIGS. 4 and 5, the data stream (a) at the input of a flip-flop 710 is taken at the timing of the clock (b) (FIG. 5A) and is output as data (a1) as shown in FIG. 5C. The clock (b) is also supplied to a flip-flop 711 as a trigger signal through a delay element 714 and an invertor 715. The inverted output of the flip-flop 711 is connected to the data input of the flip-flop 711. Therefore, the flip-flop functions as a ½ divider which changes the output state with every two pulses of the clock (b). The outputs of the flip-flop 711 and the output of the inverter 715 are provided to AND gates 716 and 717 to produce signals (a2) and (a3), respectively (FIGS. 5E and 5F). The signals (a2) and (a3) are supplied to clock terminals of flip-flops 712 and 713, respectively, the input terminals of which are supplied with the data (a1) from the flip-flop 710. In this situation, the delay time of the delay element 714 is set so that the clocks of the flip-flops 712 and 713 are delayed sufficiently longer time than the set-up time of the data (am).

As a result, as in FIGS. 5G and 5H, the data (a4) and (a5) at the outputs of the flip-flops 712 and 713 alternately hold the data in each cycle of the original data (a1) for a period of two cycle of the clock. The same procedure as above is performed for the data (c) and the clock (d) by a circuit configuration including a flip-flop 720, a delay element 724, an invertor 725, a flip-flop 721, AND gates 726 and 727, and flip-flops 722 and 723. As a result, as shown in FIGS. 5K and 5L, the data (c4) and (c5) at the outputs of the flip-flops 722 and 723 alternately hold the data in each cycle of the original data (c1) (FIG. 5D) for a period of two cycle of the clock.

The combined clock (FIG. 5M) of the clocks (b) and (d) from the OR gate 730 are provided to trigger terminals of flip-flops 731 and 732 through a delay element 733 and an invertor 734. Each output of the flip-flops 731 and 732 is connected to the input of the other flip-flop as shown in Figure so that the flip-flops 731 and 732 form a ¼ divider. Therefore, each of the outputs of the divider, i.e., the clocks e2–e5 through AND gates 735–738, changes the state with every four cycle of the clock (e1) and has a one cycle phase difference with one another (FIGS. 5N–5Q). The logical products of the data (a4), (a5), (c4) and (c5) and the clocks (e2), (e3), (e4) and (e5) are respectively obtained by gates 718–729. The outputs of the gates 718–829 are combined by an OR gate 740. Thus, the output DATA of the OR gate 740 shows the serially combined data of the parallel data (a) and (c) at the input of the parallel-serial convertor 7 with two times faster clock rate (FIG. 5R).

The data selector 8 is connected to the parallel-serial convertor 7. In this example, the data selector 8 includes four selector circuits 81, 82, 83 and 84 each of which selects either one of signals provided at a terminal A or a terminal B by a select signal provided at a terminal S. If a select signal SEL is high, each of the selector circuits 81, 82, 83, and 84 passes the data (a) and (c), and the clocks (b) and (d) from the 2-way interleaving unit 2. When the select signal SEL is low, the selector circuits 81–84 select the outputs DATA, CLK from the parallel-serial convertor 7.

Next, the outputs of the selector circuits 81, 82, 83, and 84 are applied to corresponding clock generators 21, 22, 23, and 24. The clock generator 21 contains a timing data memory 111, a counter type delay element 112, an AND gate 113, and a delay element 114, all of which are identical to the components in the clock generator 11 shown in FIG. 2. However, the clock generator 21 does not contain a timing data memory 115, a counter type delay element 116, an AND gate 117, and a delay element 118 shown in FIG. 2. Similarly, in the bock diagram of FIG. 1, each of the clock generators 22, 23, and 24 requires only a half of the circuit elements of the conventional clock generators shown in FIG. 2. The reason for this reduction in the circuit elements in the clock generators is that the interleaving scheme is not performed in the clock generators in the present invention.

Next, each generated clock CLOCK1, CLOCK2, CLOCK3 and CLOCK4 is applied to a format control unit 3. The structure and the operational procedure of the format control unit 3 are the same as that of the conventional one shown in FIG. 2. The format control unit 3 may have memories to select and combine arbitrary clocks.

The outputs of the format control unit 3 are applied to the waveform combining circuit 9. The signals corresponding to CLOCK1, CLOCK2, CLOCK3, and CLOCK4 from the control unit 3 are applied to pins S, R, L, and T, respectively. If the select signal SEL is high, these signals CLOCKs 1–4 pass through the waveform combining circuit 9 to output pins. In this situation, as in the same way in the conventional waveform formatter of FIG. 2, a RS flip flop 4 generates waveforms for tester drivers, and a RS flip flop 5 generates control signals for the tester drivers. If the select signal SEL is low, the signals DATA and CLK are applied to all of the clock generators 21, 22, 23, and 24. Therefore, the clock generators 11, 12, 13, and 14 operate in a multiplex fashion of odd cycles and even cycles.

Figure 6:
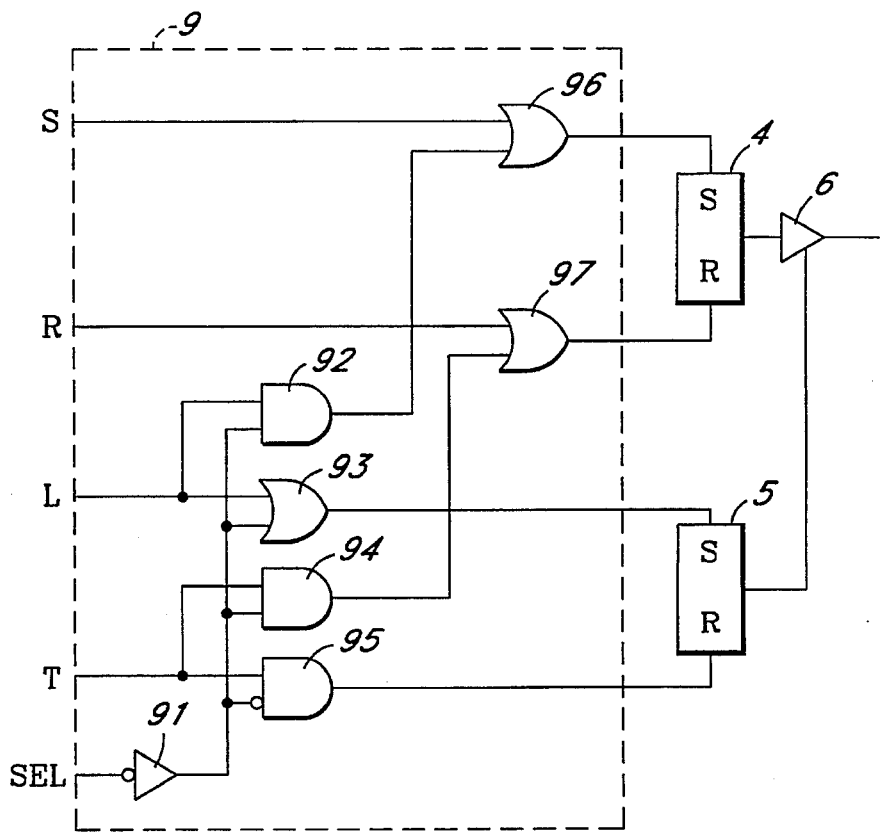
FIG. 6 is a block diagram of a waveform combining circuit of the present invention.
Figure 7:
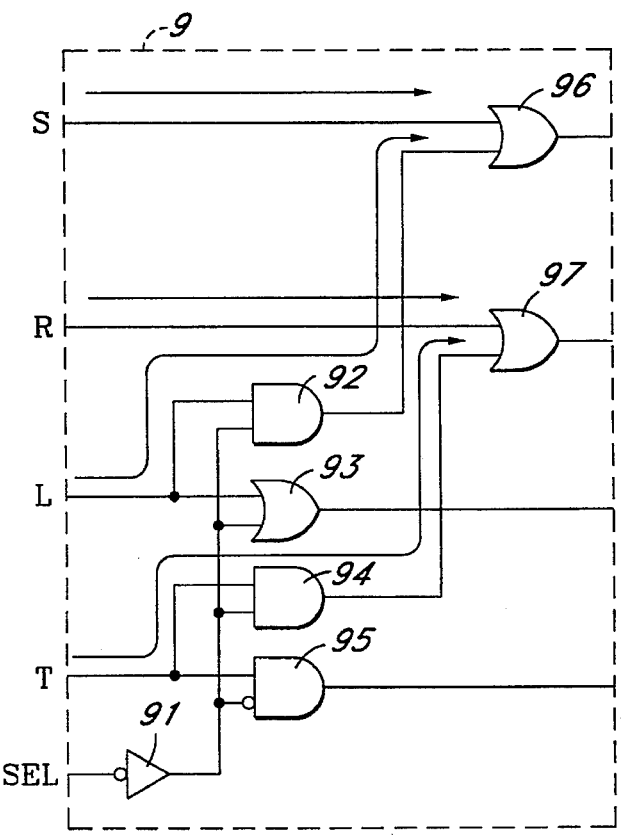
FIG. 7 is a block diagram explanatory of operation of the waveform combining circuit of FIG. 6.

FIGS. 6 shows an example of circuit diagram of the waveform combining circuit 9 of the present invention. FIG. 7 is a schematic view for explaining the operation of the waveform combining circuit 9 of FIG. 6 when the select signal SEL is low. Because AND gates 92 and 93 are opened by the high-state of output of an inverter 91, the signal at the pin L is ORed with the signal at the pin S by an OR gate 96. In the same way, the signal at the pin T is ORed with the signal at the pin R by an OR gate 97. The output of the OR gate 96 is used as a set signal of the RS flip flop 4. The output of the OR gate 97 is used as a reset signal of the RS flip flop 4. Because the waveforms of the driver 6 can be generated by multiplexing the signals S and R with the signals L and T, the same effect as that of the interleaving method can be obtained.

Further in this case, because the high-state signal from the OR gate 93 is always applied to the pin S of the RS flip flop 5 and the low-state signal from the AND gate 95 is always applied to the pin R of the RS flip flop 5, the output of the RS flip flop 5 is fixed to the high state during this setting. Therefore, the driver 6 can operate in the I/O split mode wherein a pin of the semiconductor device under test is fixed to either as an input or an output.

As mentioned above, in the waveform formatter of the present invention, the clock generators perform as generating driver control clocks in the low-speed operation and as driver waveform clocks in the high speed operation. Therefore, in the waveform formatter of the present invention, the redundant circuits in the conventional waveform formatter can be eliminated and thus the total scale of circuits can be decreased.

What is claimed is:

1. A waveform formatter for generating test signals for semiconductor devices, comprising:

a reference clock generator for generating a reference clock for said waveform formatter;

an interleave circuit for generating a plurality of clock signals and a plurality of data in a parallel form on the basis of said reference clock;

a parallel-serial convertor for converting a parallel signal to a serial signal;

a data selector for selecting signals either from said interleave circuit or said parallel-serial convertor;

a plurality of clock generators for generating clock signals based on the signals from said data selector;

a waveform combining circuit for generating waveforms by multiplexing said clock signals from said clock generators.

2. A waveform formatter as defined in claim 1, wherein said interleave circuit generates odd and even data and odd and even clocks, and said clock generators generate first, second, third and fourth clock signals.

3. A waveform formatter as defined in claim 1, wherein said formatter further includes a first flip-flop circuit and a second flip-flop circuit for receiving signals from said waveform combining circuit, and a driver for providing a test signal to said semiconductor device to be tested.

4. A waveform formatter according to claim 3, wherein said waveform combining circuit comprises:

a first AND gate for accepting a select signal and third clock signal;

a second AND gate for accepting said select signal and said fourth clock signal;

a first OR gate for accepting the output of said first AND gate and said first clock signal;

a second OR gate for accepting the output of said second AND gate and said second clock signal;

a third OR gate for accepting said select signal and said third clock signal;

a third AND gate for accepting the inverted signal of said select signal and said fourth clock signal.

5. A waveform formatter as defined in claim 4, wherein said first flip-flop circuit receives the output of said first OR gate at a set terminal and the output of said second OR gate at a reset terminal and generates waveforms for said driver, and said second flip-flop circuit receives the output of said third OR gate at set terminal and the output of third AND gate at reset terminal and generates a control signal for said driver.

* * * * *